United States Patent [19]

Kondo et al.

[11] Patent Number: 5,042,044
[45] Date of Patent: Aug. 20, 1991

[54] SEMICONDUCTOR LASER DEVICE, A SEMICONDUCTOR WAFER

[75] Inventors: Masaki Kondo, Nara; Kazuaki Sasaki, Yao; Taiji Morimoto; Mitsuhiro Matsumoto, both of Nara; Hiroyuki Hosoba; Sadayoshi Matsui, both of Tenri; Saburo Yamamoto, Uda; Takahiro Suyama, Tenri; Masafumi Kondo, Nara, all of Japan

[73] Assignee: Sharp Kabushiki Kaisha, Osaka, Japan

[21] Appl. No.: 513,508

[22] Filed: Apr. 27, 1990

[30] Foreign Application Priority Data

Apr. 28, 1989 [JP] Japan ............................ 1-111399
Jun. 7, 1989 [JP] Japan ............................ 1-145619

[51] Int. Cl.$^5$ .................................................. H01S 3/19
[52] U.S. Cl. ............................................ 372/45; 372/46; 372/502
[58] Field of Search ............................ 372/45, 46, 50

[56] References Cited

U.S. PATENT DOCUMENTS 4,317,085  2/1982  Burnham et al. ...................... 372/50

FOREIGN PATENT DOCUMENTS

| | | |
|---|---|---|
| 55-124292 | 9/1980 | Japan . |
| 0214580 | 10/1985 | Japan ................................ 372/50 |
| 61-46995 | 10/1986 | Japan . |
| 62-38875 | 8/1987 | Japan . |
| 63-21358 | 5/1988 | Japan . |
| 63-287083 | 11/1988 | Japan . |
| 63-307792 | 12/1988 | Japan . |
| 64-8689 | 1/1989 | Japan . |
| 64-31491 | 2/1989 | Japan . |
| 64-37072 | 2/1989 | Japan . |

*Primary Examiner*—Georgia Epps
*Attorney, Agent, or Firm*—Nixon & Vanderhye

[57] ABSTRACT

A semiconductor laser device and a method for the production of the semiconductor laser device are provided, which semiconductor laser device includes a striped channel formed in a semiconductor substrate through a current blocking layer on the substrate and at least two dummy grooves formed in the current blocking layer on each side of the striped channel. Also provided are a semiconductor wafer prepared for the purpose of producing optical devices with an optical waveguide, and a method for the production of the semiconductor wafer. The semiconductor wafer includes a semiconductor substrate, the surface of which has an orientation inclined from the [100] direction to one of the [011] and [01̄1] directions of an angle $\theta$ satisfying the relationship $0.1° < |\theta| < 4°$; a plurality of striped channels formed in a substrate through a current blocking layer in the direction of the other of the [011] and [01̄1] directions; and at least one dummy side groove formed between the striped channels, having a combined cross-sectional area on the plane perpendicular to the other direction greater than that of each of the striped channels.

11 Claims, 4 Drawing Sheets

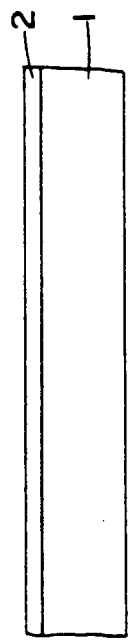 FIG. IE
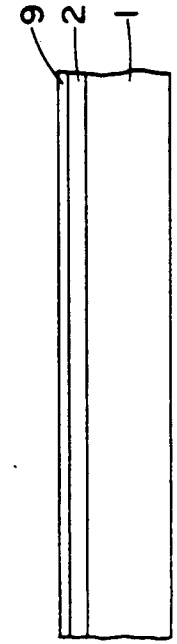 FIG. IF
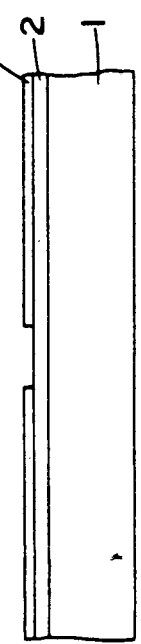 FIG. IG
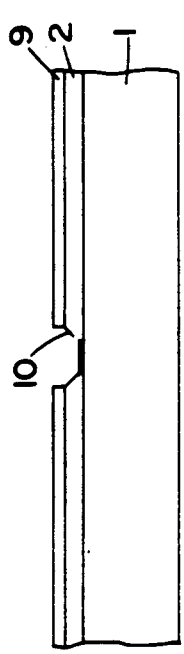 FIG. IH
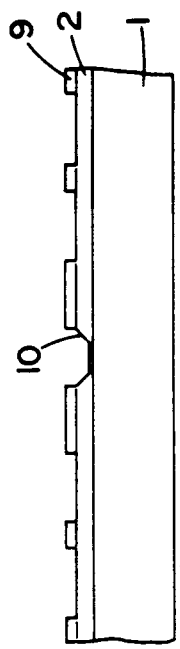 FIG. IA
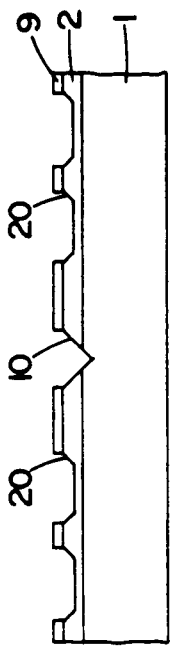 FIG. IB
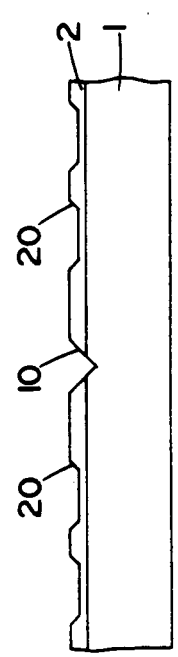 FIG. IC
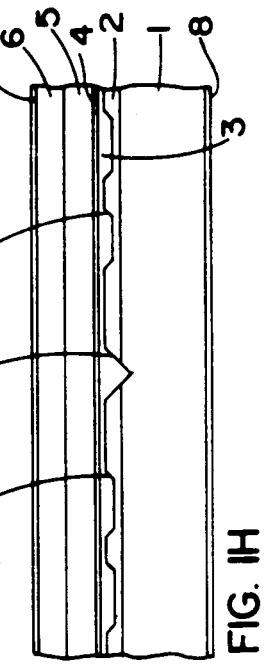 FIG. ID

SEMICONDUCTOR LASER DEVICE, A SEMICONDUCTOR WAFER

BACKGROUND OF THE INVENTION

1. Field of the Invention

This invention relates to an inner stripe semiconductor laser device and a method for the production of the semiconductor laser device. This invention further relates to a semiconductor wafer and a method for the production of the semiconductor wafer. As used herein, the term "semiconductor wafer" is referring to a semiconductor wafer with a plurality of semiconductor layers formed thereon, including an optical wave guide layer such as an active layer, which is then cleaved to produce semiconductor devices, for example, semiconductor laser devices or optical devices with an optical waveguide, such as optical branching filters, optical multiplexers, and optical switches.

2. Description of the Prior Art

In recent years, semiconductor laser devices have been extensively used as a light source for reading out the data from compact discs or video discs in optical disc driving units.

The transverse mode of laser oscillation is an important factor that affects not only the horizontal broadening angle of laser beams but also the threshold current, the current vs. optical output power characteristics, and the longitudinal mode characteristics. For the purpose of controlling the transverse mode of laser oscillation, semiconductor laser devices have a striped channel in the substrate. One example of such a semiconductor laser device is the channeled substrate planar (CSP) laser with an index waveguide structure. The V-channeled substrate inner stripe (VSIS) laser in which a striped channel is formed in the substrate through the current blocking layer is used for many applications.

One example of a VSIS laser is shown in FIG. 5. In this VSIS laser, on a p-GaAs substrate 1, an n-GaAs current blocking layer 2, a p-GaAlAs first cladding layer 3, a GaAlAs active layer 4, an n-GaAlAs second cladding layer 5, and an n-GaAs contact layer 6 are successively formed, the current blocking layer 2 having a striped channel 10 which reaches the semiconductor substrate 1. In this semiconductor laser device, the current for laser oscillation is confined to the striped channel 10. Of the light generated in the active layer 4, the light other than that above the striped channel 10 is absorbed by the current blocking layer 2 on either side of the striped channel 10, and the difference $\Delta n$ in the effective refractive index is will appear between the area of the active layer 4 above the striped channel 10 and the area outside of this area. In the VSIS semiconductor laser device, the difference in the effective refractive index makes the fundamental transverse mode stabilized. Because the striped channel 10 forms an optical waveguide and a current path, VSIS laser devices can readily be produced. However, they have the disadvantage of having a relatively high oscillation threshold current of 40 to 60 mA.

In the production of VSIS laser devices, after the current blocking layer 2 is etched to form the striped channel 10, the first cladding layer 3 is grown by liquid phase epitaxy (LPE) so that the striped channel 10 is buried therewith. In this LPE growth, the rate of crystal growth on the side surfaces of the channel 10 is greater than that on the flat portion of the current blocking layer 2. As a result, the inside of the channel 10 is selectively buried and the surface of the first cladding layer 3 grown thereon becomes flat. Here, this planarization utilizes the strong dependence of the rate of crystal growth in LPE on the surface orientation of the substrate crystals, which can also be used to flatten substrates with a ridge portion.

The threshold current in VSIS lasers can effectively be reduced by making the first cladding layer 3 as thin as possible to prevent the transverse broadening of current within the first cladding layer 3, resulting in a reduction in ineffective current. However, when the growth time for the first cladding layer 3 is set short to make this layer thinner, the striped channel 10 may not be sufficiently buried, resulting in a striped concave portion in the first cladding layer 3, as shown in FIG. 6. When the active layer 4 is grown on the first cladding layer 3 with such a striped concave portion, the active layer 4 has a curved portion 11. In a semiconductor laser device with such a curved active layer, the transverse refractive index differs from that in normal devices, so that the far-field pattern of the laser beam will not be stabilized and the maximum optical output power may be lowered.

To prevent the occurrence of a curved portion in the active layer 4 when the first cladding layer 3 is made thin, the crystal growth on the flat portion of the current blocking layer 2 should be allowed to slow down sufficiently. For the purpose of accomplishing this slowdown of crystal growth, the following configurations can be considered:

(1) Ridge portion provided in the current blocking layer and the stripped channel formed in the ridge portion; and (2) Grooves (dummy grooves) similar to the striped channel (main channel), formed on each side of the striped channel.

Examples of the configuration (1) above include the buried twin-ridge substrate (BTRS) structure shown in FIG. 7. In this structure, two parallel shown in FIG. 7. In this structure, two parallel ridge 12a and 12b are formed on a terrace 13 in the substrate 1, and the striped channel 10 is formed between the ridges. In the growth of the first cladding layer 3, the growth on the side surfaces of the ridges 12a and 12b is accelerated due to the anisotropic property of crystal growth, so that the crystal growth on the flat portions of the ridges 12a and 12b slows down. This causes the striped channel 10 to become completely buried and the cladding layer 3 on both ridges ca be made thin.

Semiconductor laser devices with the respective structures shown in FIG. 8 and FIG. 9 are examples of the configuration (2). In these structures, dummy grooves 20 with the same depth as that of the striped channel 10 are formed on each side of the striped channel 10. In the semiconductor laser device shown in FIG. 8, only the striped channel 10 is formed on top of a terrace 13 in the substrate 1 to reach the substrate 1. Therefore, only the striped channel 10 serves as a current path. Furthermore, in the semiconductor laser device shown in FIG. 13, the striped channel 10 and the dummy grooves 20 all reach the substrate 1. To confine the current at the striped channel 10, grooves 14 are formed on each side of the striped channel 10 to prevent the current from leaking to the dummy grooves 20.

In the structures shown in FIG. 8 and FIG. 9, when the first cladding layer 3 is grown on the current blocking layer 2 by LPE, the crystal growth on the dummy grooves 20 is accelerated due to the orientation-dependent anisotropic property of crystal growth, so that the crystal growth on the flat portions of the current blocking layer 2 between channels slows down. Therefore, the striped channel 10 can be completely buried and the first cladding layer 3 on each side of the striped channel 10 can be made thin.

However, in both cases of the BTRS structure shown in FIG. 7 and the structure shown in FIG. 8, the substrate 1 must be etched to form the terrace 9. Furthermore, in the structure shown in FIG. 9, the grooves 14 for current confinement must be formed after the crystal growth step. As can be seen, each improvement has the disadvantage of an increase in the number of production steps for forming a current confining structure.

In the actual mass production of the VSIS laser device shown in FIG. 5, the great variation in the oscillation threshold current $I_{th}$ in the range of from 40 to 70 mA may be observed. Moreover, the measurements of current vs. optical output power characteristics (I-L characteristics) show that the optical output power may saturate at 5 to 15 mW. This phenomenon is known as the I-L kink, which is one of the causes of the production yield of semiconductor laser devices being decreased.

The following can be considered as the causes of the above-mentioned failure in device characteristics. First, the layer thickness of the active layer 4 above the striped channel 10 is not uniform, so that there will occur light loss, and, as shown in the upper part of FIG. 5, the effective refractive index difference Δn becomes asymmetric on the right and left sides above the striped channel 10. Also, when LPE growth is performed on the striped channel 10, the shape of the striped channel 10 becomes asymmetric on the right and left sides due to the occurrence of meltback, resulting in an asymmetrical difference Δn in the effective refractive index on the right and left sides.

In order to investigate the uniformity in the thickness of the active layer 4, a wafer was produced in which the Ga solution was removed from the growth surface after the LPE growth of the first cladding layer 3 and the active layer 4 shown in FIG. 5. FIGS. 10 and 11 are schematically exaggerated diagrams of the wafer. FIG. 10 shows the case where a semiconductor substrate was used with a surface which has a substantially uninclined orientation (i.e., orientation inclined by an angle of less than ±0.1 degrees, for example, from the [100] direction to the [01$\bar{1}$] direction). As shown in FIG. 10, striped concave portions are observed in the active layer 4 along the striped channels 10. These striped concave portions in the active layer 4 arise from the depressions in the vicinity of the striped channel 10 in the first cladding layer 3. The depressions in the first cladding layer 3 cause lack of uniformity in the thickness of the active layer 4 formed thereon.

FIG. 11 shows the case where a semiconductor substrate was used with a surface which has an orientation inclined from the [100] direction to the [01$\bar{1}$] direction by an angle of ±0.1 degrees or more. In this case, a stepped growth pattern is observed on the surface of the grown layer in the vicinity of the striped channels 10.

As can be seen, regardless of the degree of inclination with respect to the surface orientation of the substrate, the surface of the first cladding layer 3 does not become flat in the vicinity of the striped channels 10. This lack of flatness on the surface of the first cladding layer 3 shows variations in thickness of several hundred angstroms over a distance of several microns, so that it cannot be observed even by means of a scanning electron microscope (SEM). This lack of flatness occurs within the area 250 μm × 300 μm which is the general size of semiconductor laser chips, and it not only causes the above-mentioned I-L kink but also induces light intensity noise and particularly noise due to returned light. It not only causes variations in thickness over the entire surface of a wafer which is several centimeters square, but also causes variations in the threshold current, far-field pattern, and other fundamental characteristics of semiconductor laser devices obtained from the same wafer.

SUMMARY OF THE INVENTION

The semiconductor laser device of this invention, which overcomes the above-discussed and numerous other disadvantages and deficiencies of the prior art, comprises a semiconductor substrate of a first conductivity type; a current blocking layer of a second conductivity type formed on the substrate, through which a striped channel is formed in the substrate; and a multi-layered structure formed on the current blocking layer and successively having a first cladding layer of the first conductivity type, an active layer for laser oscillation, and a second cladding layer of the second conductivity type; wherein at least two dummy grooves which do not reach the substrate are formed in the current blocking layer on each side of the striped channel.

In a preferred embodiment, the striped channel has a V-shaped cross section.

In a preferred embodiment, the first and second cladding layers have a carrier concentration in the range of $1 \times 10^{17} - 7 \times 10^{17}$ cm$^{-3}$.

In a preferred embodiment, the multi-layered structure further comprises a contact layer of the second conductivity type formed on the second cladding layer.

In a more preferred embodiment, the above-mentioned semiconductor laser device further comprises a first electrode formed under the substrate and a second electrode formed on the contact layer.

The method for the production of a semiconductor laser device of this invention, which overcomes the above-discussed and numerous other disadvantages and deficiencies of the prior art, comprises the steps of forming on a semiconductor substrate of a first conductivity type, a current blocking layer of a second conductivity type; etching the current blocking layer, so that a first striped groove which does not reach the substrate is formed in the current blocking layer; and etching the current blocking layer and substrate, so that the first striped groove is formed into a striped channel which reaches the substrate, and at least two dummy grooves which do not reach the substrate are formed on each side of the striped channel.

In a preferred embodiment, the abovementioned method for the production of a semiconductor laser device further comprises a step of growing a multi-layered structure on the current blocking layer after the etching steps, the multi-layered structure successively having a first cladding layer of the first conductivity type, an active layer for laser oscillation, and a second cladding layer of the second conductivity type.

In a preferred embodiment, the etching steps are conducted with an etchant containing sulfuric acid.

In a preferred embodiment, the multi-layered structure is grown by liquid phase epitaxy.

The semiconductor wafer, which overcomes the above-discussed and numerous other disadvantages and deficiencies of the prior art, comprises a semiconductor substrate with a surface orientation inclined from the [100] direction to one of the [01$\bar{1}$] and [01$\bar{1}$] directions by an angle $\theta$ satisfying the relationship $0.1° < |\theta| < 4°$; a current blocking layer formed on the substrate; a plurality of striped channels formed in the substrate through the current blocking layer in the direction of the other of the [01$\bar{1}$] amd [01$\bar{1}$] directions; at least two dummy side groove formed between the striped channels, wherein the combined cross-sectional area, on the plane perpendicular to the other direction, of the dummy side groove or grooves positioned between the striped channels is greater than that of each of the striped channels; and a multilayered structure formed on the current blocking layer and successively having a first cladding layer, an optical waveguide layer, and a second cladding layer.

In a preferred embodiment, the orientation of the substrate surface is inclined from the [100] direction to the [01$\bar{1}$] direction by an angle of 0.5 degrees.

The method for the production of a semiconductor wafer, which overcomes the above-discussed and numerous other disadvantages and deficiencies of the prior art, comprises the steps of providing a semiconductor substrate having a surface orientation inclined from the [100] direction to one of the [01$\bar{1}$] and [01$\bar{1}$] directions by an angle $\theta$ satisfying the relationship $0.1° < |\theta| < 4°$; forming a current blocking layer on the substrate; and etching the substrate and current blocking layer, so that a plurality of striped channels are formed in the substrate through the current blocking layer and at least two dummy side groove which does not reach the substrate is formed between the striped channels in the current blocking layer, wherein the combined cross-sectional area, on the plane perpendicular to the other of the [01$\bar{1}$] and [01$\bar{1}$] directions, of the dummy side groove or grooves positioned between the striped channels is greater than that of each of the striped channels.

In a preferred embodiment, the abovementioned method for the production of a semiconductor wafer further comprises a step of growing a multi-layered structure on the current blocking layer, the multi-layered structure successively having a first cladding layer, an optical waveguide layer, and a second cladding layer.

In a preferred embodiment, the current blocking layer is grown for a sufficient time so as to form a striped concave portion on the current blocking layer above and parallel to each of the striped channels, and the active layer is grown so as to have a curved portion on the striped concave portion of the current blocking layer.

The semiconductor laser device of this invention, which overcomes the above-discussed and numerous other disadvantages and deficiencies of the prior art, comprises a semiconductor substrate with a surface orientation inclined from the [100] direction to one of the [01$\bar{1}$] and [01$\bar{1}$] directions by an angle $\theta$ satisfying the relationship $0.1° < |\theta| < 4°$; a current blocking layer formed on the substrate; at least one striped channel formed in the substrate through the current blocking layer in the direction of the other of the [01$\bar{1}$] and [01$\bar{1}$] directions; at least two dummy side grooves formed in the current blocking layer so as not to reach the substrate on each side of the striped channel or channels, wherein the combined cross-sectional area, on the plane perpendicular to the other direction, of the dummy side grooves is greater than the cross-sectional area of the striped channel; and a multi-layered structure formed on the current blocking layer and successively having a first cladding layer, an active layer for laser oscillation, and a second cladding layer.

In a preferred embodiment, the striped channel has a V-shaped cross section.

In a preferred embodiment, the multi-layered structure further comprises a cap layer formed on the second cladding layer.

In a preferred embodiment, the abovementioned semiconductor laser device further comprises a first electrode formed under the substrate and a second electrode formed on the cap layer.

Thus, the invention described herein makes possible the objectives of (1) providing a semiconductor laser device with a structure which is readily constructed because thin semiconductor layers can be grown on each side of a striped channel without forming curved portions in an active layer; (2) providing a method for the production of such a semiconductor laser device; (3) providing a semiconductor wafer with a structure in which an optical waveguide layer such as an active layer can be formed to have an even flatness without causing variations in the thickness of the optical waveguide layer over the same wafer; and (4) providing a method for the production of such a semiconductor wafer.

The semiconductor laser device of this invention can be produced with a flat substrate, so that there is no need to form a particular terrace in the substrate or ridges in the current blocking layer, thus simplifying the production steps. Also, there is no need for additional current confining means such as Zn diffusion layers and striped grooves after the formation of semiconductor layers. A thin semiconductor layer without concave portions can be grown on the current blocking layer, so that the formation of curved portions in the active layer formed thereon is prevented and the far-field pattern of the laser beam is stabilized. Furthermore, since ineffective current due to current broadening can be reduced, thereby attaining a low operating current.

In the method for the production of a semiconductor wafer of this invention, the angle $\theta$ by which the surface orientation of the semiconductor substrate is inclined from the [100] direction to the [01$\bar{1}$] or [01$\bar{1}$] direction is greater than 0.1 degrees and less than 4.0 degrees. Also, a striped channel and dummy side grooves are formed in the direction perpendicular to the direction of inclination with this angle. The cross-sectional area on a plane perpendicular to the stripe direction of the dummy side grooves between the striped channels is greater than that of each of the striped channels, so that the surface of the semiconductor layer formed on the dummy side grooves takes a step-like shape. It was found that by forming a step-like shape of the semiconductor layer on the dummy side grooves, a facet-like growth surface close to the (100) plane was formed above the striped channel. Therefore, when on top of a semiconductor substrate in which a striped channel and dummy side grooves have been formed, an active layer and cladding layers are formed to produce semiconductor laser devices, the active layer with superior flatness can be obtained above the striped channel. Furthermore, it was found that the right-to-left symmetry of the striped channel was retained. Therefore, semiconductor laser devices obtained from this semiconductor wafer have an extremely low oscillation threshold current and the optical output power at which the I-L kink appears is higher than that of conventional semiconductor laser devices, thus yielding a high output power. In addition, returned light noise is significantly reduced and semiconductor laser devices obtained from the same wafer have highly uniform fundamental characteristics such as oscillation threshold current, oscillation wavelength, and farfield pattern.

If the angle $\theta$ of inclination from the [100] direction of the surface orientation of the semiconductor substrate is 4.0 degrees or greater, the surface of the grown layer above the striped channel also takes a step-like or wave-like shape, which is not preferred. Also, if the angle of inclination from the [100] direction is 0.1 degrees or less, a large step-like shape does not form above the dummy side grooves, therefore, the surface of the grown layer above the striped channel does not take the facet-like shape described above.

In the method for the production of a semiconductor wafer of this invention, the growth time of the cladding layer formed on the striped channel is set short, so that the cladding layer having a concave portion parallel to and above the striped channel is obtained. Since dummy side grooves are formed on each side of the striped channel, the cladding layer is grown with a good right-to-left symmetry and the right-to-left symmetry of the concave portion is also high. When the right-to-left symmetry of the concave portion is high, the active layer formed on the cladding layer with this concave portion is formed to have a curved portion with an extremely good right-to-left symmetry on the concave portion of the cladding layer. When the active layer has a curved portion with a high right-to-left symmetry, the emission spot becomes smaller, thereby attaining an extremely small oscillation threshold current.

According to the method for the production of a semiconductor wafer of this invention, uniform optical waveguide layers are formed above the striped channel formed on the semiconductor substrate without causing variations in the thickness thereof over the same substrate. Therefore, optical devices with consistent characteristics can be obtained from semiconductor wafers formed by the production method of this invention. When this invention is applied to semiconductor laser devices, for example, oscillation threshold current will be reduced, optical output will be made higher, returned light noise will be reduced, and variations in these characteristic values will be reduced, thus improving the performance of the semiconductor laser devices and raising the production yield thereof.

BRIEF DESCRIPTION OF THE DRAWINGS

This invention may be better understood and its numerous objects and advantages will become apparent to those skilled in the art by reference to the accompanying drawings as follows:

FIGS. 1A-1H are sectional views showing the production of a semiconductor laser device of this invention.

DESCRIPTION OF THE PREFERRED EMBODIMENTS

EXAMPLE 1

Figure 2:
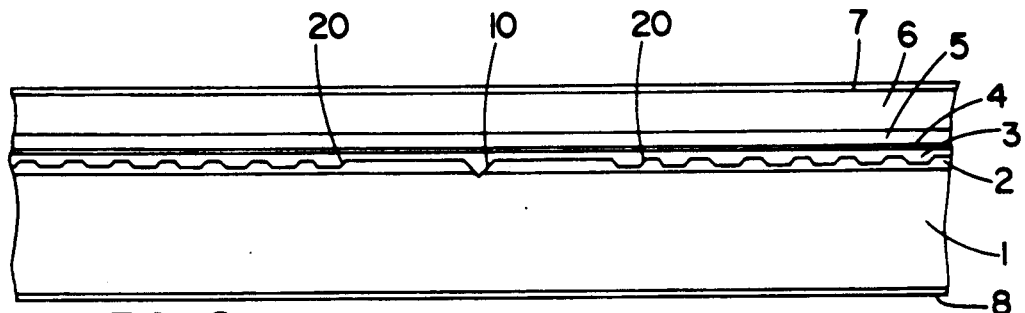
FIG. 2 is a sectional view showing the semiconductor laser device of FIGS. 1A-1H.

FIG. 2 shows a semiconductor laser device of this invention. This semiconductor laser device has a VSIS structure in which an n-GaAs current blocking layer 2 (0.8 $\mu$m thick), a p-GaAlAs first cladding layer 3 (0.05-0.15 $\mu$m thick; containing magnesium as an impurity; carrier concentration, $1 \times 10^{18}$ cm$^{-3}$), a GaAlAs active layer 4 (0.1 $\mu$m thick), an n-GaAlAs second cladding layer 5 (1.2 $\mu$m thick; containing tellurium as an impurity; carrier concentration, $1 \times 10^{18}$ cm$^{-3}$), and an n-GaAs contact layer 6 (5 $\mu$m thick) are successively formed on a p-GaAs substrate 1. Also, a p-sided electrode 8 is formed under the substrate 1, and an n-sided electrode 7 is formed on the contact layer 6.

A striped channel 10 with a V-shaped cross section (5 $\mu$m wide and 1.2 $\mu$m deep) is formed in the substrate 1 through the current blocking layer 2. A plurality of dummy grooves 20 are formed on each side of the striped channel 10. The depth of these dummy grooves 20 is 0.4–0.5 $\mu$m, and they are formed so as not to extend through the current blocking layer 2. The dummy grooves 20 (3 $\mu$m wide) are formed at a pitch of 7 $\mu$m over the entire surface except the striped areas about 20 $\mu$m wide on each side of the striped channel 10.

In the VSIS laser of this example, a first cladding layer 3 without concave portions in the surface thereof is formed. The thickness of the first cladding layer 3 on each side of the striped channel 10 is 0.05 $\mu$m. Therefore, the inefficient current flowing laterally in the first cladding layer 3 during operation is reduced, and the current required for laser oscillation flows mainly in the striped channel 10. In this example, the oscillation threshold current was 30 mA. Also, since the active layer 4 was not curved, the far-field pattern of the laser beam was stable.

In the above-mentioned example, although the carrier concentration in the p-GaAlAs first cladding layer 3 was $1 \times 10^{18}$ cm$^{-3}$, it was observed that by lowering this concentration the oscillation threshold current decreased further. For example, when the carrier concentration was $5 \times 10^{17}$ cm$^{-3}$, the oscillation threshold current was 27 mA. Such a decrease in oscillation threshold current was observed in the carrier concentration range of $1 \times 10^{17}$ cm$^{-3}$, the $7 \times 10^{17}$ cm$^{-3}$ in the first cladding layer 3. The reason for this is considered to be the further suppression of current broadening in the first cladding layer 3 on each side of the striped channel 10.

In addition, the n-GaAlAs second cladding layer 5 contained tellurium as an impurity at a carrier concentration of $1 \times 10^{18}$ cm$^{-3}$, and it was also observed that lowering this concentration further lowered the oscillation threshold current. For example, at a carrier concentration of $5 \times 10^{17}$ cm$^{-3}$ in the second cladding layer 5, the oscillation threshold current was 25 mA. Such a decrease in oscillation threshold current was observed in the carrier concentration range of $1 \times 10^{17}$–$7 \times 10^{17}$ cm$^{-3}$ in the second cladding layer 5. The reason for this is considered to be a decrease in the number of crystal defects associated with the tellurium impurities in the second cladding layer 5.

Next will be an explanation of the method for the production of a VSIS laser with the above-described structure.

First, as shown in FIG. 1A, on a p-GaAs substrate 1, an n-GaAs layer was grown as the current blocking layer 2 by LPE to a thickness of approximately 0.8 μm. This current blocking layer 2 may also have a multi-layered structure containing an n-GaAlAs layer. A photoresist 9 was then applied to the surface of the current blocking layer 2 as shown in FIG. 1B, and the center portion of the photoresist 9 was removed by exposure to light and development to form a resist mask of a striped pattern as shown in FIG. 1C.

The first etching step was performed with an etchant containing sulfuric acid ($H_2SO_4$:$H_2O_2$:$H_2O$ = 1:2:50) to form a striped channel with a depth of 0.75 μm as shown in FIG. 1D. Then, without removing the photoresist 9, a multi-striped pattern for the dummy grooves 20 was formed in the photoresist 9 by exposure to light and development as shown in FIG. 1E. Next, the second etching step was performed on the current blocking layer 2 with the same etchant as above to thereby form the dummy grooves 20 as shown in FIG. 1F. The dummy grooves 20 were formed to have a depth of 0.45 μm which was smaller than the thickness of the current blocking layer 2, so that they did not extend through the current blocking layer 2. This second etching, however, did cause the striped channel 10 to extend through the current blocking layer 2 down to the substrate 1.

The photoresist 9 was then removed as shown in FIG. 1G, and the p-GaAlAs first cladding layer 3 was formed by LPE. Since the dummy grooves 20 in the current blocking layer 2 significantly slowed the growth rate on the flat portions thereof, the thickness of the first cladding layer 3 on the flat portions was kept to only approximately 0.05 μm, while the striped channel 10 was completely filled in. After forming the first cladding layer 3 with no concave portions in the surface thereof, the GaAlAs active layer 4, n-GaAlAs second cladding layer 5, and n-GaAs contact layer 6 were successively formed by epitaxial growth to form a double hetero-structure. Next, the electrodes 7 and 8 were formed on the back face of the substrate 1 and the upper face of the contact layer 6, respectively, by vapor deposition of electrode materials, thus completing the production of the semiconductor laser device of this example.

EXAMPLE 2

Figure 3A:
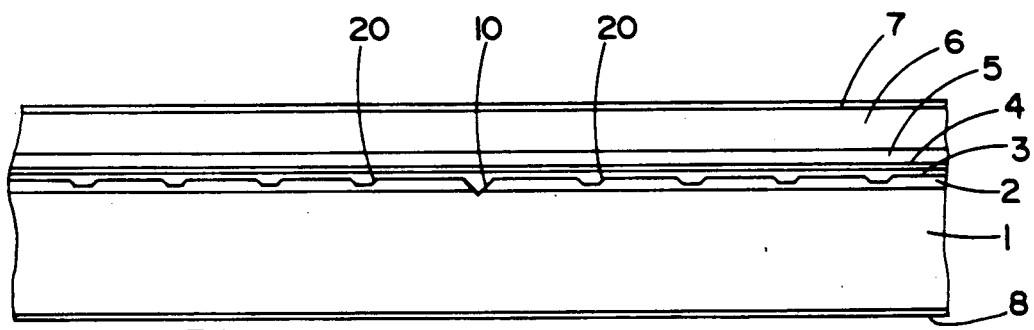
FIG. 3A is a sectional view showing another semiconductor laser device of this invention.

FIG. 3A shows another semiconductor laser device of this invention. The semiconductor laser device of FIG. 3A differs from that of FIG. 2 with respect to only the width, number, and pitch of the dummy grooves 20. The width and pitch of the dummy grooves 20 in the semiconductor laser device of FIG. 3A are 3 μm and 20 μm, respectively. This semiconductor laser device exhibited the same excellent performance as that of FIG. 2. As can be seen, the width, number, and pitch of the dummy grooves 20 are not limited to particular values in this invention. The crystal growth rate could be slowed by increasing the width and number of the dummy grooves and or making their pitch smaller. Even though the number of the dummy grooves 20 formed were two or three, the first cladding layer 3 could be made thin without forming curved portions in the active layer 4.

EXAMPLE 3

Figure 3B:
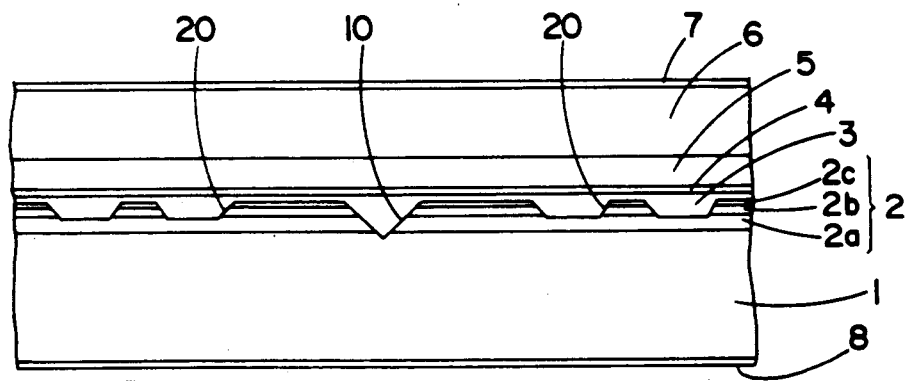
FIG. 3B is a sectional view showing still another semiconductor laser device of this invention.

FIG. 3B shows still another semiconductor laser device of this invention. When the pitch of the dummy grooves 20 is small and there are no flat portions between the dummy grooves 20, or when the current blocking layer is made of n-GaAs and the flat portions have an extremely small width, meltback occurs on the current blocking layer 2 between the dummy grooves 20 during the growth of the first cladding layer 3. When meltback occurs, the active layer 4 has curved portions above the dummy grooves 20 and becomes thinner above the striped channel 10. This makes it difficult to control layer thickness. Therefore, in this example, for the purpose of minimizing the degree of meltback on the current blocking layer 2, a three-layered structure composed of a first n-GaAs layer 2a (0.4 μm thick), an n-GaAlAs anti-meltback layer 2b (0.3 μm thick), and a second n-GaAs layer 2c (0.1 μm thick) was applied to the current blocking layer 2.

In the Examples 1–3 above, even if the conductivity type of each semiconductor layer is reversed, the same effect can be obtained. Also, other semiconductor materials such as InGaAsP/InP or InGaAlP/GaAs may be used. In addition, the formation of the current injection path and the formation of the transverse refractive index difference can be performed by means of Zn diffusion, formation of a ridge structure, burying techniques, or the like.

In the Examples 1–3 above, although the dummy grooves 20 were formed in continuous stripe shapes parallel to the striped channel 10, it is not necessary to form the dummy grooves 20 parallel to the striped channel 10. The dummy grooves 20 can be formed in any direction, and they need not be continuous. That is, the dummy grooves 20 can have any shape as long as they accelerate crystal growth on the concave portions and retard crystal growth on the flat portions of the current blocking layer 2 due to the orientation-dependent anisotropic property of the crystal growth.

EXAMPLE 4

Figure 4:
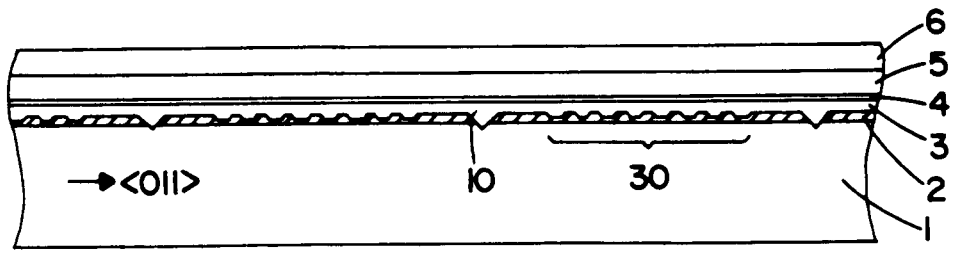
FIG. 4 is a sectional view showing a semiconductor wafer provided with a plurality of dummy grooves of this invention.
Figure 5:
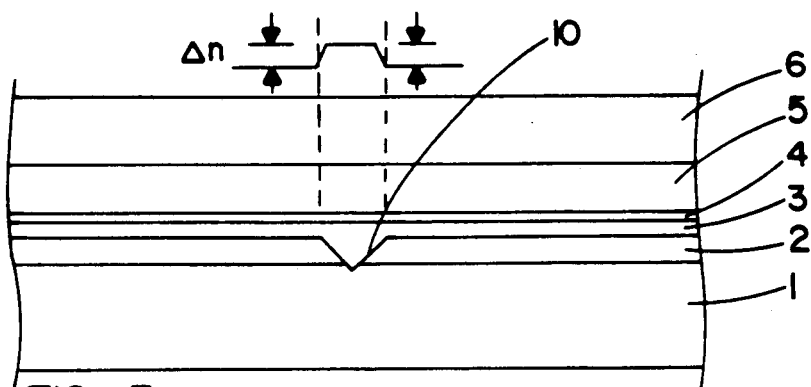
FIGS. 5-7 are sectional views showing conventional semiconductor laser devices.
Figure 6:
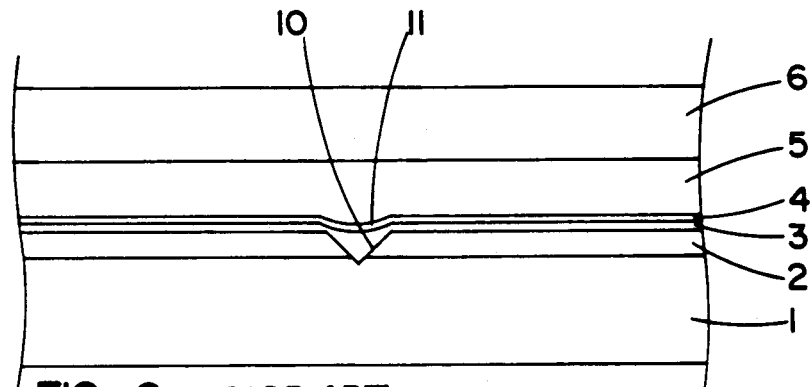
Figure 7:
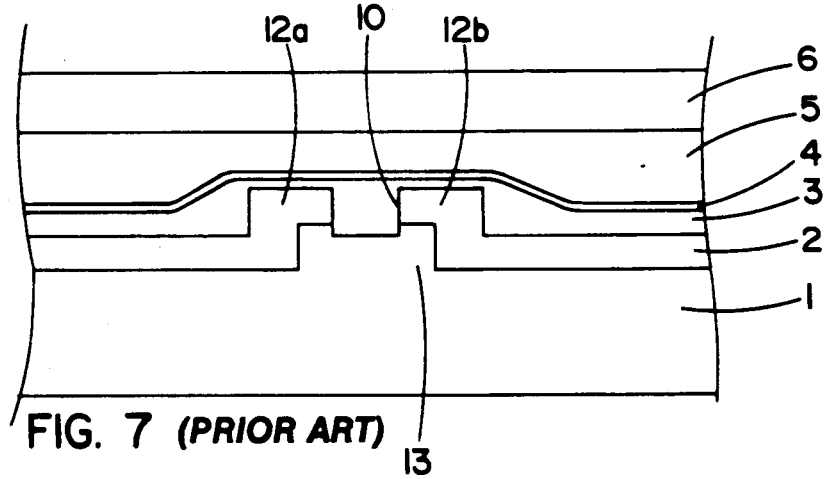
Figure 8:
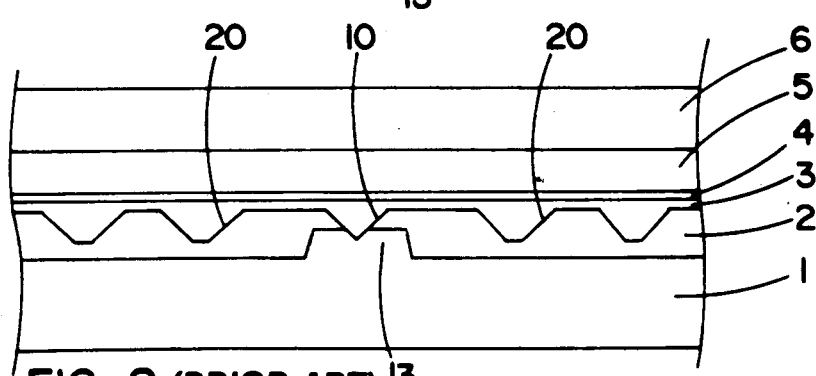
FIGS. 8 and 9 are sectional views showing conventional improved semiconductor laser devices.
Figure 9:
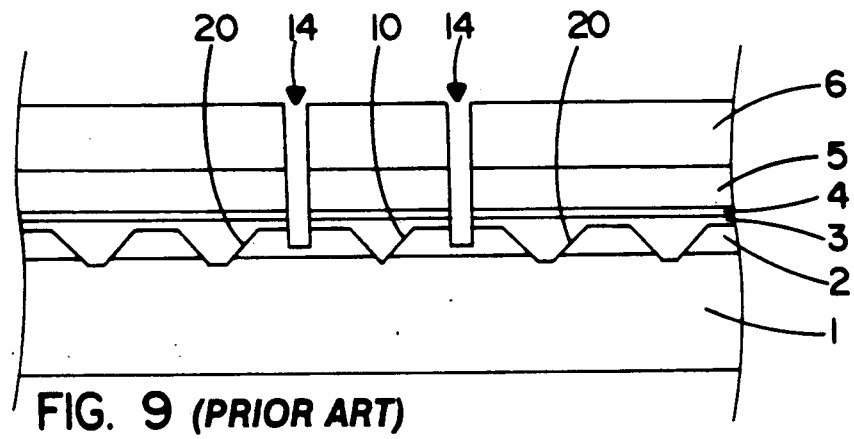
Figure 10:
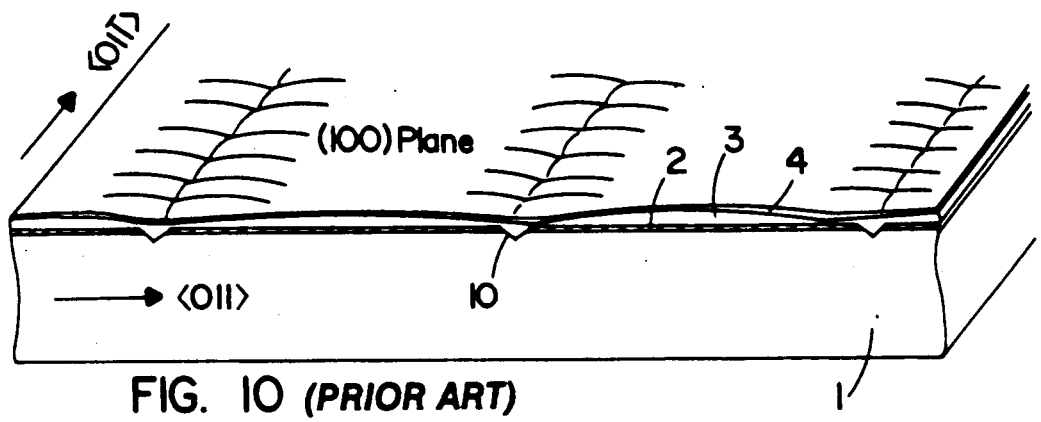
FIGS. 10 and 11 are schematically perspective views showing the surface condition of conventional semiconductor wafers after the growth of an active layer, which are prepared for the purpose of producing VSIS semiconductor laser devices.
Figure 11:
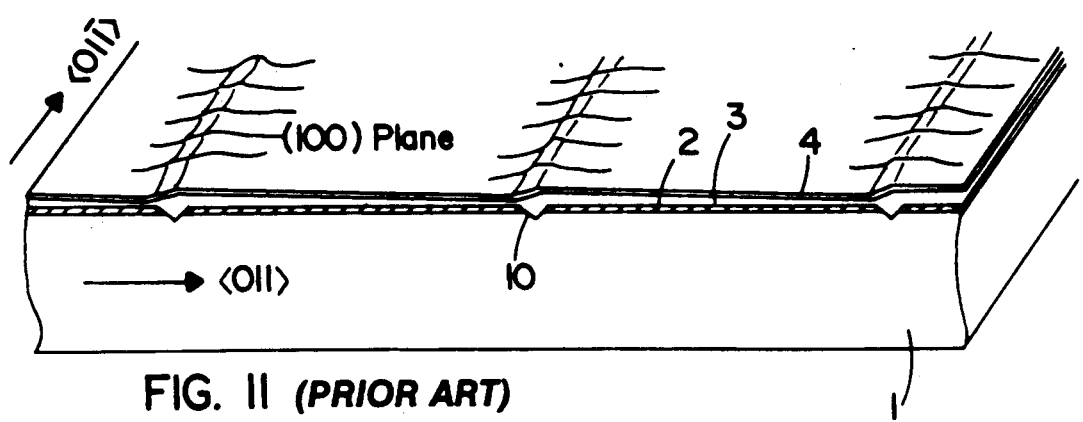

FIG. 4 shows still another semiconductor wafer prepared by the production method of this invention. In this example, a plurality of dummy side grooves 30 are formed, and each of the dummy side grooves 30 has a depth smaller than the thickness of the current blocking layer 2. Each of the dummy side grooves 30 is formed so that the combined crosssectional area of the dummy side grooves 30 positioned between the striped channels 10 is greater than that of each of the striped channels 10. Twenty-five dummy side grooves 30 with a rectangular cross section 3 μm wide and 0.6 μm deep were formed at intervals of 7 μm in the direction [011] of the same p-GaAs substrate 1 as in Example 4. The areas 243 μm wide where the dummy side grooves 30 had been formed were formed at a pitch of 300 μm. The combined cross-sectional area of the dummy side grooves 30 was 45 μm$^2$. V-striped channels 10 which were 4 μm wide and 1.3 μm deep cross-sectional area, 2.6 μm$^2$) were formed at the same pitch of 300 μm in the middle of the areas (57 μm wide) where the dummy side grooves 30 were not formed.

In the semiconductor laser device obtained in this example, the combined cross-sectional area of the dummy side grooves 30 was relatively large compared with single dummy side groove embodiments, therefore, the oscillation threshold current, oscillation wavelength, far-field pattern, and other those obtained with devices having single dummy grooves. Moreover, the fundamental characteristics of the semiconductor laser devices obtained from the same semiconductor wafer were extremely uniform. In addition, since the dummy side grooves 30 of this example also function as the dummy grooves 20 in Example 1, the first cladding layer 3 can be made extremely thin. When the first cladding layer 3 can be made thin, the ineffective current flowing laterally in the first cladding layer 3 during operation is reduced, so that the current required for laser oscillation flows mainly in the striped channel 10. The concentration of current in the striped channel 10 reduces the oscillation threshold current.

In Example 4, although all of the stripped semiconductor layers were grown by LPE, the same effect can be obtained when the current blocking layer or the double hetero structure is grown by molecular beam epitaxy (MBE) or organometallic vapor phase epitaxy In Example 4, although the striped channels were formed in the [01$\bar{1}$] direction, they can also be formed in the [011] direction. In this case, the surface orientation of semiconductor substrates must be inclined from the [100] direction to the [011] direction by an angle of 0.1-4 degrees.

In Example 4, although the GaAs-GaAlAs semiconductor wafers were described, this invention can also be applied to InP-InGaAsP semiconductor wafers.

In Example 4, although the semiconductor substrates with a surface orientation in the [100] direction, this invention can also be applied to semiconductor substrate with a surface orientation in the [111] direction.

In Example 4, although the semiconductor wafers were used for the production of semiconductor laser devices, this invention can also be applied to the preparation of semiconductor wafers for the production of optical devices with an optical waveguide, such as optical branching filters, optical multiplexers, and optical switches.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising:
   a semiconductor substrate of a first conductivity type;
   a current blocking layer of a second conductivity type formed on said substrate, through which a striped channel is formed in said substrate; and
   a multi-layered structure formed on said current blocking layer and successively having a first cladding layer of the first conductivity type, an active layer for laser oscillation, and a second cladding layer of the second conductivity type;
   wherein at least two dummy grooves which do not reach the substrate are formed in said current blocking layer on each side of said striped channel.

2. A semiconductor laser device according to claim 1, wherein said striped channel has a V-shaped cross section.

3. A semiconductor laser device according to claim 1, wherein said multi-layered structure further comprises a contact layer of the second conductivity type formed on said second cladding layer.

4. A semiconductor laser device according to claim 3, further comprising a first electrode formed under said substrate and a second electrode formed on said contact layer.

5. A semiconductor laser device according to claim 1, wherein said first and second cladding layers have a carrier concentration in the range of $1 \times 10^{17} - 7 \times 10^{17}$ cm$^{-3}$.

6. In a semiconductor wafer comprising:
   a semiconductor substrate with a surface orientation inclined from the [100] direction to one of the [011] and [01$\bar{1}$] directions by an angle $\theta$ satisfying the relationship $0.1° < |\theta| < 4°$;
   a current blocking layer formed on said substrate;
   a plurality of striped channels formed in the substrate through said current blocking layer in the direction of the other of the [01$\bar{1}$] and [01$\bar{1}$] directions;
   at least two dummy side grooves formed between the striped channels, which do not reach the substrate, wherein the combined cross-sectional area, on the plane perpendicular to the other direction, of said dummy side grooves positioned between the striped channels is greater than that of each of said striped channels; and
   a multi-layered structure formed on said current blocking layer and successively having a first cladding layer, an optical waveguide layer, and a second cladding layer.

7. A semiconductor wafer according to claim 6, wherein said orientation of the substrate surface is inclined from the [100] direction to the [01$\bar{1}$] direction by an angle of 0.5 degrees.

8. In a semiconductor device comprising:
   a semiconductor substrate with a surface orientation inclined from the [100] direction to one of the [011] and [01$\bar{1}$] directions by an angle $\theta$ satisfying the relationship $0.1° < |\theta| < 4°$;
   a current blocking layer formed on said substrate;
   at least one striped channel formed in the substrate through said current blocking layer in the direction of the other of the [01$\bar{1}$] and [01$\bar{1}$] directions;
   at least two dummy side grooves formed in the current blocking layer so as not to reach the substrate on each side of said striped channel or channels, wherein the combined cross-sectional area, on the plane perpendicular to the other direction, of said dummy side grooves is greater than the cross-sectional area of said striped channel; and
   a multi-layered structure formed on said current blocking layer and successively having a first cladding layer, an active layer for laser oscillation, and a second cladding layer.

9. A semiconductor laser device according to claim 8, wherein said striped channel has a V-shaped cross section.

10. A semiconductor laser device according to claim 8, wherein said multi-layered structure further comprises a cap layer formed on said second cladding layer.

11. A semiconductor laser device according to claim 10, further comprising a first electrode formed under said substrate and a second electrode formed on said cap layer.

* * * * *